(12) United States Patent
Kinstle, III et al.

(10) Patent No.: US 10,459,498 B1
(45) Date of Patent: Oct. 29, 2019

(54) HEAT DISSIPATION IN A THREE CHAMBER CHASSIS OF A PERSONAL COMPUTER

(71) Applicant: Corsair Memory, Inc., Fremont, CA (US)

(72) Inventors: Robert Michael Kinstle, III, Fremont, CA (US); Dennis Wai Cheung Lee, Fremont, CA (US); Joseph-Eamonn L. Clerkin, Fremont, CA (US); Dustin Alexander Sklavos, Fremont, CA (US)

(73) Assignee: Corsair Memory, Inc., Fremont, CA (US)

( * ) Notice: Subject to any disclaimer, the term of this patent is extended or adjusted under 35 U.S.C. 154(b) by 0 days.

(21) Appl. No.: 16/241,983

(22) Filed: Jan. 7, 2019

Related U.S. Application Data

(60) Provisional application No. 62/788,941, filed on Jan. 6, 2019.

(51) Int. Cl.
*G06F 1/20* (2006.01)
*H05K 7/20* (2006.01)
*H05K 5/02* (2006.01)

(52) U.S. Cl.
CPC ............ *G06F 1/20* (2013.01); *H05K 5/0213* (2013.01); *H05K 7/20172* (2013.01); *H05K 7/20272* (2013.01)

(58) Field of Classification Search
CPC . G06F 1/20; G06F 1/181; G06F 1/183; G06F 1/184; G06F 1/16; G06F 2200/201; G06F 1/206; H05K 7/20809; H05K 7/20727; H05K 7/20736; H05K 7/20145; H05K 5/02; H05K 7/1488; H05K 7/20836; H05K 7/20209; H05K 7/20909; H05K 5/0021; H05K 7/20136; H05K 7/20172; H05K 7/20545; H05K 7/20918; H01L 23/467; H01L 2224/49171
USPC .......... 361/679.46, 724, 679.02, 679.48, 695
See application file for complete search history.

(56) References Cited

U.S. PATENT DOCUMENTS

| | | | |
|---|---|---|---|
| 2007/0133167 A1* | 6/2007 | Wagner | H05K 7/20727 361/679.4 |
| 2011/0110029 A1* | 5/2011 | Lodhia | G06F 1/20 361/679.47 |

* cited by examiner

*Primary Examiner* — Mandeep S Buttar
(74) *Attorney, Agent, or Firm* — Carina Tan

(57) ABSTRACT

According to certain embodiments, a computer chassis is divided into three isolated thermal chambers to confine the heat loads in separately managed areas.

13 Claims, 8 Drawing Sheets

HEAT DISSIPATION IN A THREE CHAMBER CHASSIS OF A PERSONAL COMPUTER

CROSS-REFERENCE TO RELATED APPLICATIONS

The present application claims the benefit of U.S. Provisional Patent Application Ser. No. 62/788,941, filed Jan. 6, 2019 and entitled "Heat Dissipation in a Three Chamber Chassis of a Personal Computer," which is hereby incorporated by reference in its entirety.

The present application is related to U.S. patent application Ser. No. 15/182,355, filed Jun. 14, 2016 and entitled "Forced and Natural Convection Liquid Cooler for Personal Computer," which is hereby incorporated by reference in its entirety.

TECHNICAL FIELD

The present invention is directed to small form factor computers with high performance hardware.

BRIEF DESCRIPTION OF THE DRAWINGS

For a better understanding of the aforementioned aspects of the invention as well as additional aspects and embodiments thereof, reference should be made to the Detailed Description of the Invention below, in conjunction with the following drawings in which like reference numerals refer to corresponding parts throughout the figures.

DETAILED DESCRIPTION OF THE INVENTION

Methods, systems, user interfaces, and other aspects of the invention are described. Reference will be made to certain embodiments of the invention, examples of which are illustrated in the accompanying drawings. While the invention will be described in conjunction with the embodiments, it will be understood that it is not intended to limit the invention to these particular embodiments alone. On the contrary, the invention is intended to cover alternatives, modifications and equivalents that are within the spirit and scope of the invention. The specification and drawings are, accordingly, to be regarded in an illustrative rather than a restrictive sense.

Moreover, in the following description, numerous specific details are set forth to provide a thorough understanding of the present invention. However, it will be apparent to one of ordinary skill in the art that the invention may be practiced without these particular details. In other instances, methods, procedures, components, and networks that are well known to those of ordinary skill in the art are not described in detail to avoid obscuring aspects of the present invention.

Consumers demand small form factor computers with high performance hardware. However, small computers often are not able to cool high-powered central processing units (CPU's) and graphics processing units (GPU's) at acceptable noise levels. Many computer systems use top down fans that blow heat from the CPU and/or GPU onto the motherboard components, and thus further exacerbate the system cooling problems. Small computer cases often rely on high-speed small diameter fans (e.g., 40 mm, 60 mm, 80 mm) that spin at high speeds and that create a lot of noise.

Figure 1:
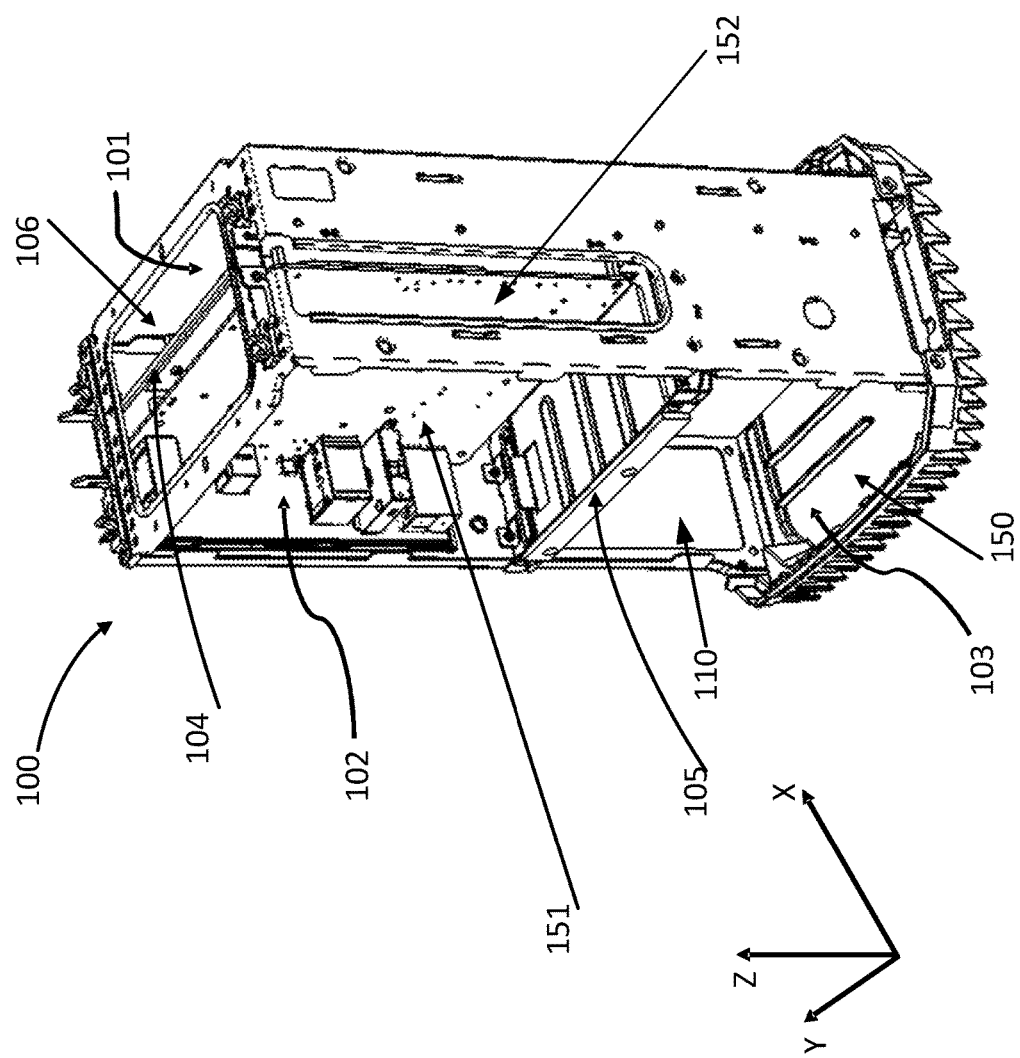
FIG. 1 is a front left perspective view of a three chamber computer chassis, according to certain embodiments.

FIG. 1 is a front left perspective view of a computer chassis 100, according to certain embodiments. Chassis 100 houses the computer cooling system and other computer components. The cooling system comprises several components working together to efficiently remove heat from the system at low levels of noise. Such cooling system components include: radiator(s) pump(s), cold plates, tubing, chassis exhaust fan and control systems, as non-limiting examples. Chassis 100 comprises 3 thermal chambers, namely: 1) a first thermal chamber 101 (e.g., a Graphics Processing Unit "GPU" chamber), 2) a second thermal chamber 102 (e.g., a motherboard chamber and its attendant Central Processing Unit "CPU"), and 3) a third thermal chamber 103 (e.g., a power supply unit chamber), according to certain embodiments. The GPU will generate heat in first thermal chamber 101. Likewise, a motherboard and its attendant CPU (not shown in FIG. 1) will generate heat in second thermal chamber 102. The power supply unit (not shown in FIG. 1) will also generate heat in third thermal chamber 103.

Chassis 100 has a top opening 106 where a chassis exhaust fan can be mounted, according to certain embodiments. Chassis 100 is divided longitudinally by a midplane or central bulkhead 104. Midplane or central bulkhead 104 is oriented in the YZ plane and runs the height of chassis 100 along the Z direction. Further, there is a chamber partition 105 (e.g., a hard disk drive tray) that separates the second thermal chamber 102 (motherboard chamber) from the third thermal chamber 103 (power supply unit chamber), according to certain embodiments. According to certain embodiments, chamber partition 105 is a removable baffle oriented in the X-Y plane and runs the depth of chassis 100 in the Y direction. Thus, the 3 thermal chambers as described herein are fairly isolated thermally from each other. The embodiments are not restricted to the locations of the GPU chamber, motherboard chamber and power supply unit chamber relative to each other in the chassis, as shown in FIG. 1. The relative locations, within the chassis, of the GPU chamber, motherboard chamber and power supply unit chamber may vary from implementation to implementation. FIG. 1 also shows opening 110 in the rear of chassis 100. According to certain embodiments, a power supply unit that is installed in third thermal chamber 103 in chassis 100 can exhaust warm air through opening 110 so as to expel the warm air that is inside third thermal chamber 103, as explained in greater detail herein with reference to FIG. 5. Further, there may be a plurality of openings or vents on the sides of chassis 100 such as in the areas 150, 151, 152, 153 (see FIG. 2 for area 153). Such openings or vents on the sides of the chassis either allow cool air to be drawn into the interior of the chassis or allow warm air from the interior of the chassis to be expelled to the exterior environment. Thus, the three thermal chambers 101, 102, 103 help confine the heat loads in separately managed areas.

In the drawings of chassis 100 herein, not all of the outer panels of the chassis are shown so as to not obscure the interior of the chassis from view.

According to certain embodiments, chamber partition 105 is removable to make it easier to install a hard drive disk in chassis 100. This removable baffle promotes more effective heat transfer by reducing the volume of the thermal chambers, thus increasing laminar flow across the hot components of the motherboard, according to certain embodiments.

Figure 2:
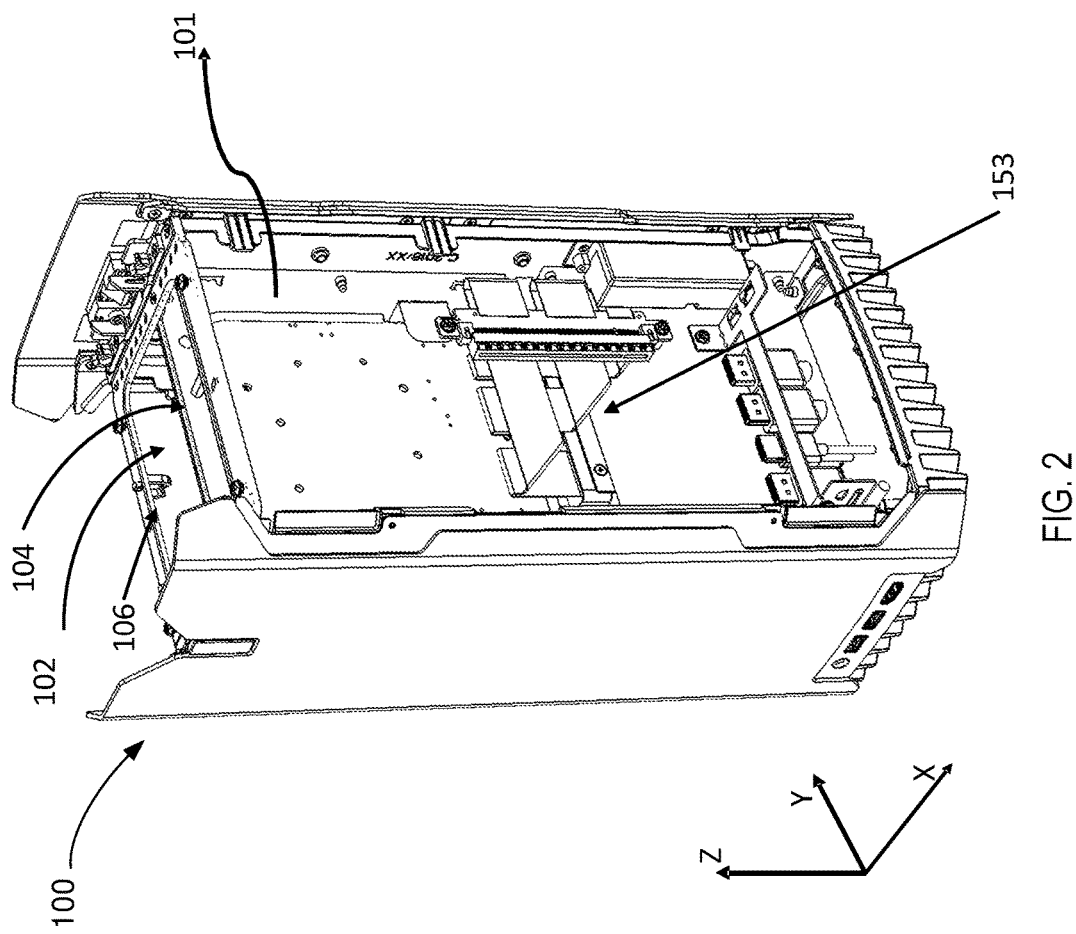
FIG. 2 is a front right perspective view of the three chamber computer chassis, according to certain embodiments, according to certain embodiments.
Figure 3:
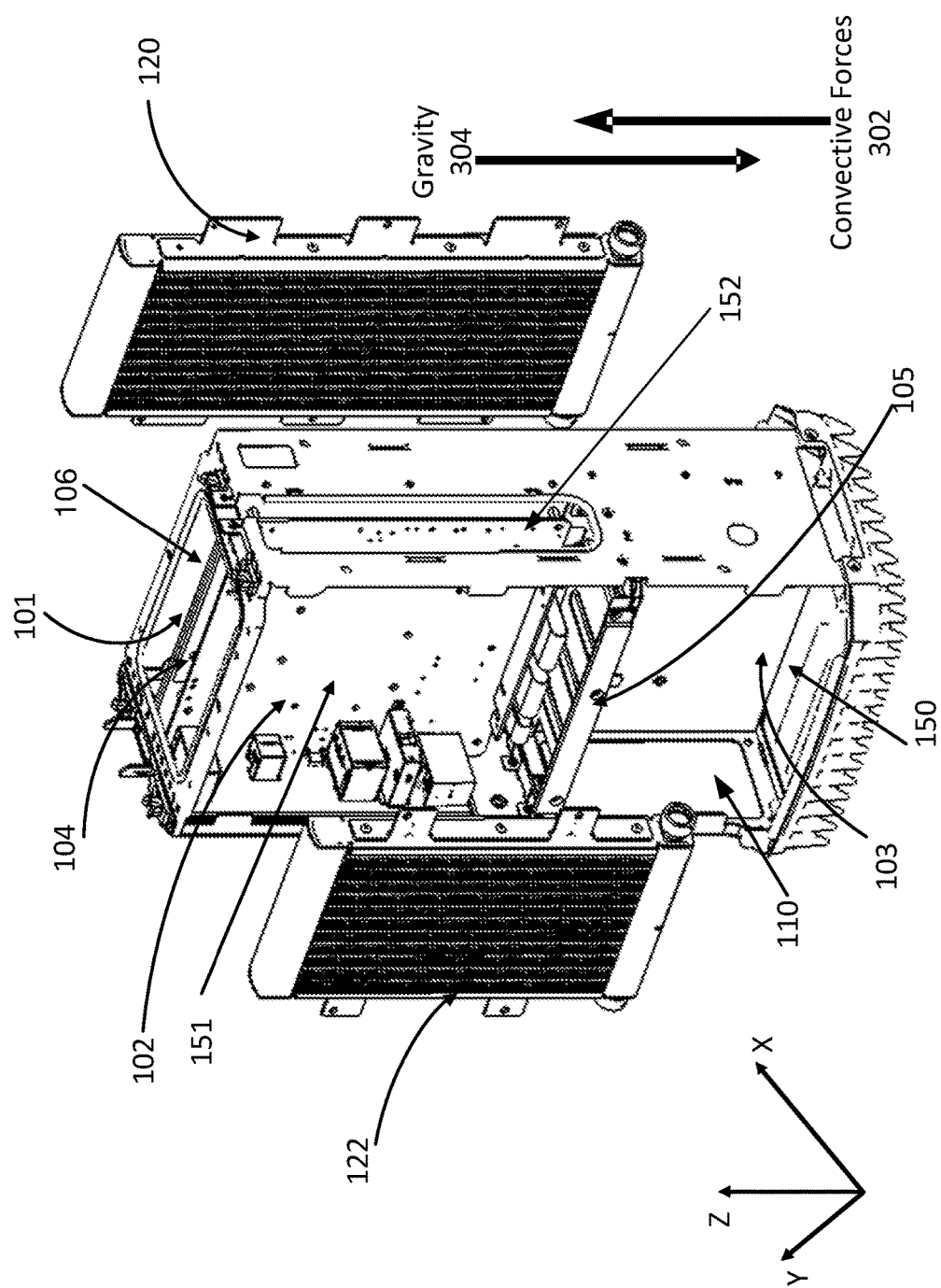
FIG. 3 is a front perspective view of chassis to illustrate placement of radiators, according to certain embodiments.
Figure 4:
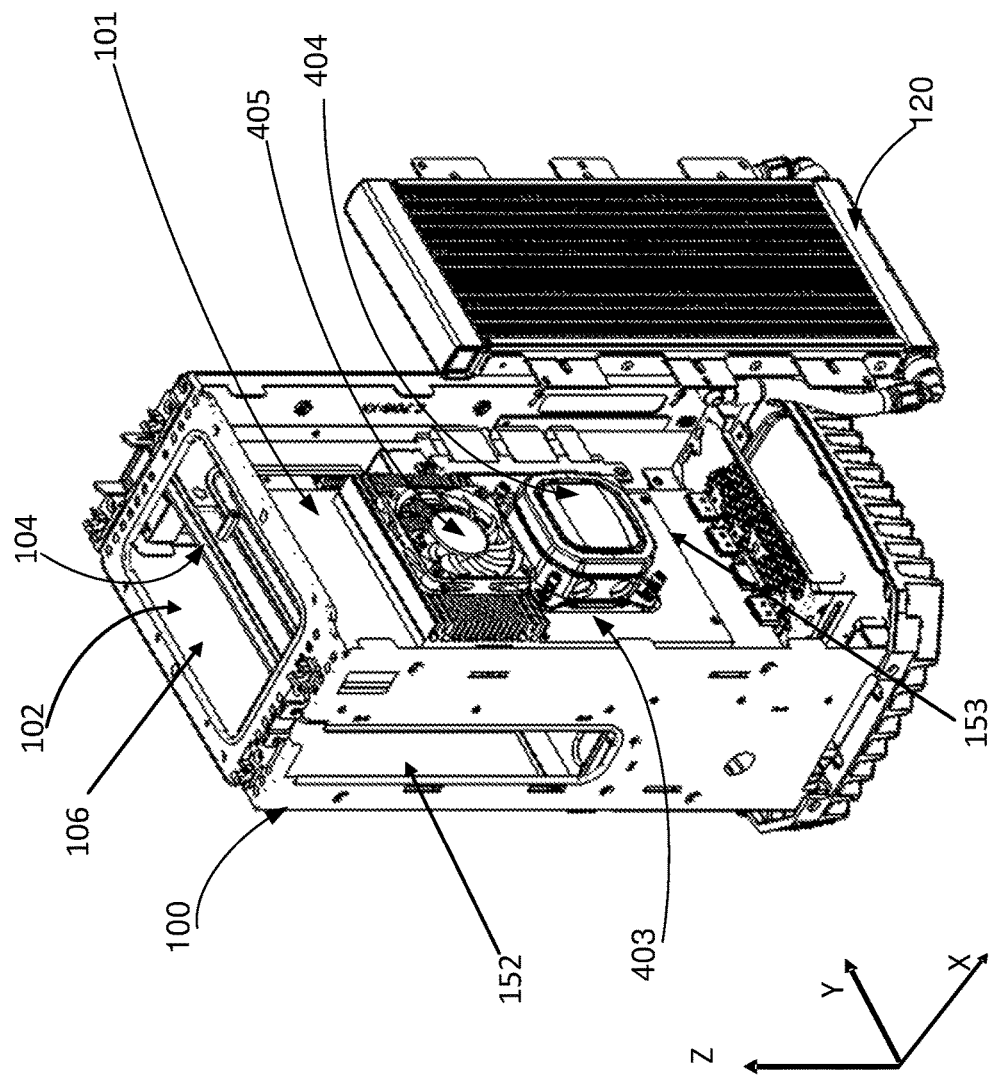
FIG. 4 is a front perspective view of the chassis showing a first thermal chamber in greater detail, according to certain embodiments.
Figure 5:
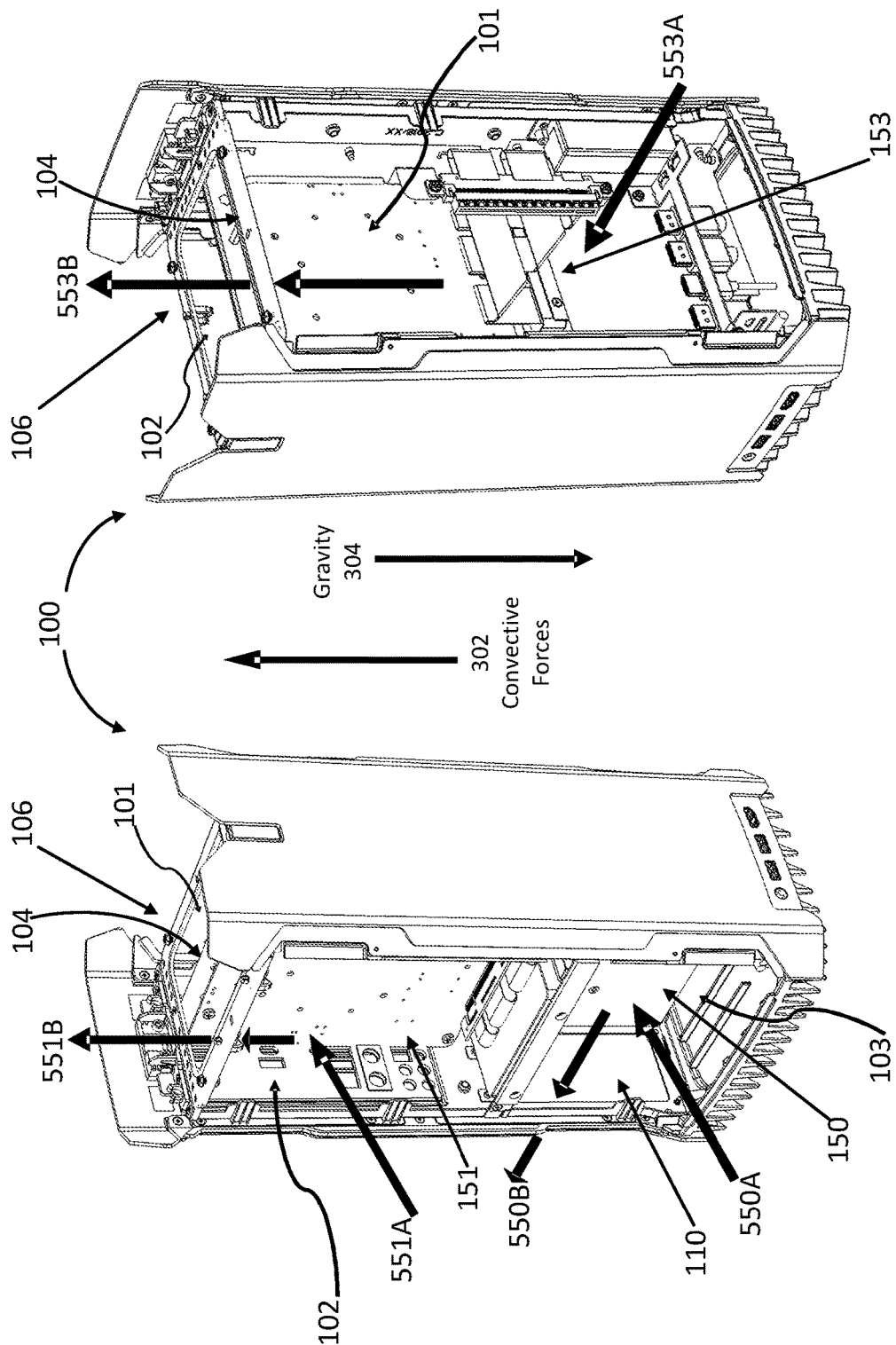
FIG. 5 illustrates airflow through a 3-thermal chamber chassis, according to certain embodiments.

FIG. 2 is a front right perspective view of computer chassis 100, according to certain embodiments. Not all of the outer panels of the chassis are shown so as to not obscure the interior of the chassis from view. The rear perspective view of FIG. 2 clearly shows the first thermal chamber 101 (e.g., GPU chamber) which runs the height of chassis 100. As previously explained herein, midplane or central bulkhead 104 is shown to also run the height of chassis 100 and separates first thermal chamber 101 from the other two thermal chambers (102 and 103). FIG. 2 also shows area 153 where openings or vents can be located on the sides of the chassis for air circulation. Thus, the GPU is mounted on the other side of the motherboard in its own thermal chamber and is connected to the motherboard via a flexible cable (e.g., a Peripheral Connect Interface Express "PCIe" cable) as further described herein with reference to FIG. 6 and FIG. 7. Such a configuration of the GPU relative to the motherboard reduces the chassis size along the X axis (the central plane of the motherboard is along the Y axis). Thus, such a configuration allows for a compact form factor of the chassis FIG. 3 is a front perspective view of chassis 100 showing placement of radiators. Not all of the outer panels of the chassis are shown so as to not obscure the interior of the chassis from view. FIG. 3 shows a GPU (graphics processing unit) radiator 120 and a CPU (central processing unit) radiator 122, according to certain embodiments. CPU radiator 122 is a part of a CPU liquid cooler that can be mounted inside second thermal chamber 102 (motherboard chamber). The water block and pump (not shown in FIG. 3) of the CPU liquid cooler will be mounted over the CPU to cool the CPU. Similarly, GPU radiator 120 is a part of a GPU liquid that can be mounted inside first thermal chamber 101 (GPU chamber). Likewise, the water block and pump (not shown in FIG. 3) of the GPU liquid cooler will be mounted over the GPU to cool the GPU. Radiators (120, 122) are described in further detail herein with reference to FIG. 8, herein. The primary heat transfer area may be inside of the chassis (e.g., the heat from the GPU and CPU are respectively transferred to the liquid coolant in their associated liquid coolers, whereby the liquid coolant is cooled by the respective radiators 120, 122 and their attendant fans). The radiators (120, 122) in turn transfer the heat to the surrounding air in the first thermal chamber 101 and second thermal chamber 102, respectively. Also, the heat transfer area may occur outside of the chassis via openings of chassis 100. For example, a chassis exhaust fan can be mounted at top opening 106 and can pull the heat from the first and second thermal chambers through top opening 106. Even in the absence of a chassis exhaust fan, the heat from the first and second thermal chambers (101, 102) will rise due to convective forces 302 and subsequently flow up through top opening 106 to exit chassis 100. Convective forces 302 are in the opposite direction to gravity 304. Further, cool air can be drawn into chassis 100 through vents on the side of chassis 100 at locations 110, 150 and 153 (location 153 is shown in FIG. 2, FIG. 4, and FIG. 5). Hot air can also exit chassis 100 through such vents. As another example, the power supply unit's fan can draw cool air from outside chassis 100 through vents at location 150 and can exhaust heat though the rear opening 110 at third thermal chamber 103.

FIG. 4 is a front perspective view of the chassis showing thermal chamber 101 in greater detail, according to certain embodiments. Not all of the outer panels of the chassis are shown so as to not obscure the interior of the chassis from view. FIG. 4 shows a GPU 403 with a liquid cooler 404 (and attendant pump) installed over GPU 403 in first thermal chamber 101. FIG. 4 also shows GPU radiator 120 for removing heat from hot liquid coolant leaving GPU liquid cooler 404. After the liquid coolant is cooled by GPU radiator 120, the cooled liquid coolant returns to the water block (not shown) in GPU liquid cooler 404 to cool GPU 403. The heat from GPU radiator 120 is transferred to the surrounding air in first thermal chamber 101. The heated air in first thermal chamber 101 exits chassis 101 through opening 106 and or through vents located at location 153 either by means of passive convective forces or forced convective forces (e.g., with the help of an exhaust fan installed at the openings to pull the warm air out of the chassis). FIG. 4 also shows a heat sink 405 to remove heat from a GPU Voltage Regulator Module "VRM" (and attendant cooling fan). Midplane or central bulkhead 104 thermally isolates first thermal chamber 101 from the second thermal chamber 102 and third thermal chamber 103.

FIG. 5 illustrates airflow through a 3-thermal chamber chassis, according to certain embodiments. Not all of the outer panels of the chassis are shown so as to not obscure the interior of the chassis from view. Heat can be carried out of the chassis by the airflow through the chambers with the aid of natural convective forces 302 which are in an opposite direction to gravity 304. An exhaust fan can also be mounted to the top opening 106 of chassis 100 to suck the hot air out of chassis 100, according to certain embodiments. The three thermal chambers 101, 102, 103 help confine the heat loads in separately managed areas. In some embodiments, the exhaust fan can be turned off and the system can rely on convection for airflow and cooling. FIG. 5 shows airflow 553A of cool air entering chassis 100 through vents on the sides of chassis at location 153. The cool airflow 553A transfers heat from heat sources (such as GPU, GPU radiator, GPU VRM heat sink, etc.) in first thermal chamber 101. As airflow 553A warms up, it rises as a result of convective forces and flows out (553B) of the first thermal chamber 101 through opening 106. FIG. 5 also shows airflow 551A of cool air entering second thermal chamber 102 through vents on the sides of chassis 100 at location 151. The cool airflow 551A transfers heat from heat sources (such as the CPU, CPU radiator, and other heat sources on the motherboard) in second thermal chamber 102. As airflow 551A warms up, it rises as a result of convective forces and flows out (551B) of the second thermal chamber 102 through opening 106. Further, FIG. 5 shows airflow 550A of cool air entering third thermal chamber 103 through vents on the sides of chassis 100 at location 150. The cool airflow 550A transfers heat from heat sources such as the power supply unit in third thermal chamber 103. As airflow 550A warms up, it flows out (550B) the third thermal chamber 103 through opening 110.

Figure 6:
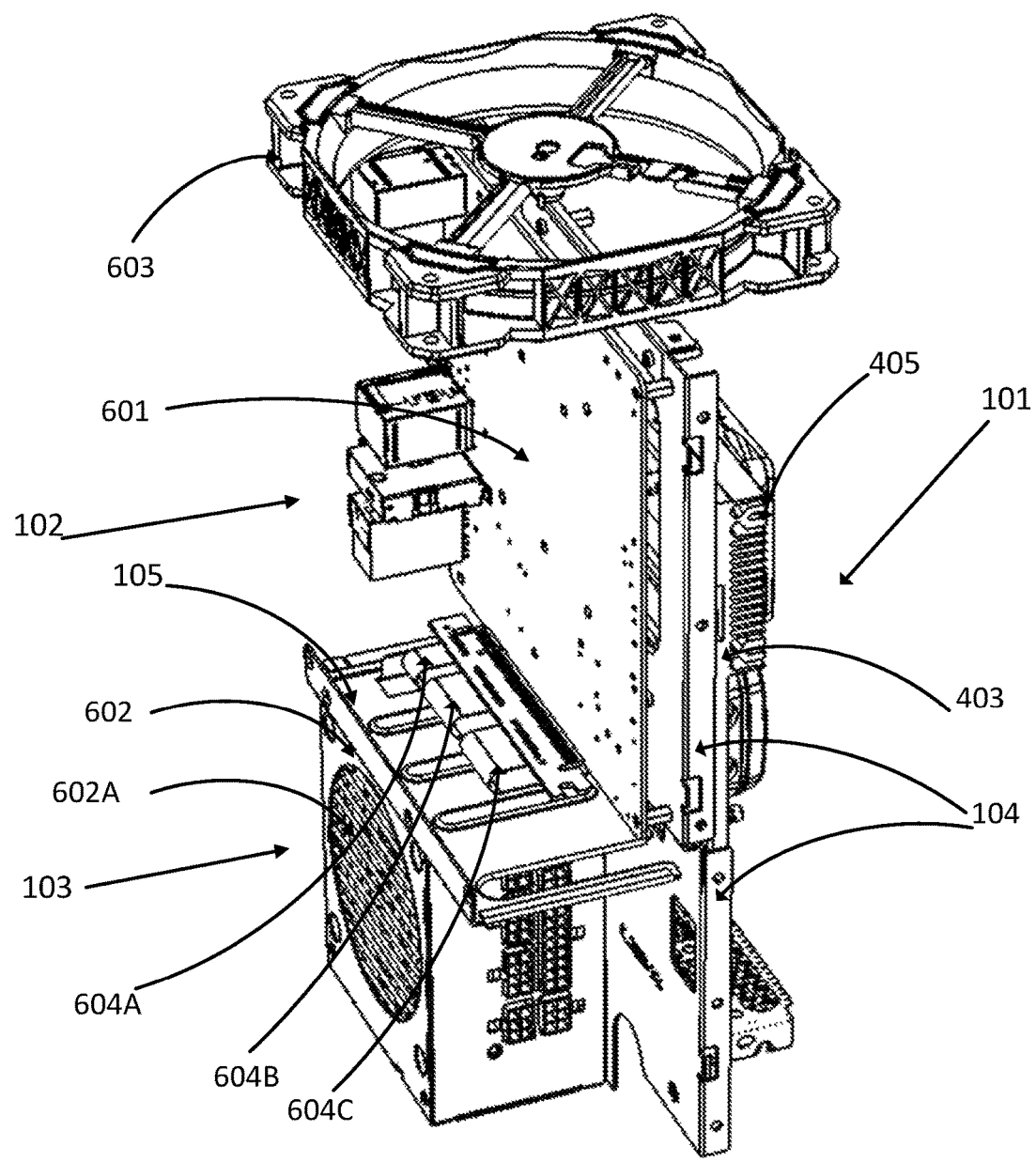
FIG. 6 is perspective view of placement of some of the main heat sources in the computer chassis, according to certain embodiments.

FIG. 6 is perspective view of placement of some of the main heat sources in the computer chassis, according to certain embodiments. FIG. 6 shows midplane or central bulkhead 104 and chamber partition 105 that function together to thermally isolate thermal chambers 101, 102, 103. FIG. 6 also shows the main heat sources namely, GPU 403 and GPU VRM heatsink 405 in first thermal chamber 101, motherboard 601 (with its attendant CPU) in second thermal chamber 102, and power supply unit 602 (with its built-in fan 602A) in third thermal chamber 103. Fan 602A can draw cool air from outside the chassis and heated air can exit the chassis through the rear opening at third thermal chamber 103. FIG. 6 also shows a chassis exhaust fan 603 that can be mounted on top pf the chassis to pull heated air out of the first thermal chamber 101 and second thermal chamber 102 when exhaust fan 603 is turned on. According to certain embodiments, exhaust fan 603 automatically turns on when either the GPU or CPU liquid coolant temperature reaches a certain pre-determined threshold. FIG. 6 also shows PCIe ribbon cables 604A, 604B, 604C for connecting GPU 403 with motherboard 601.

Figure 7:
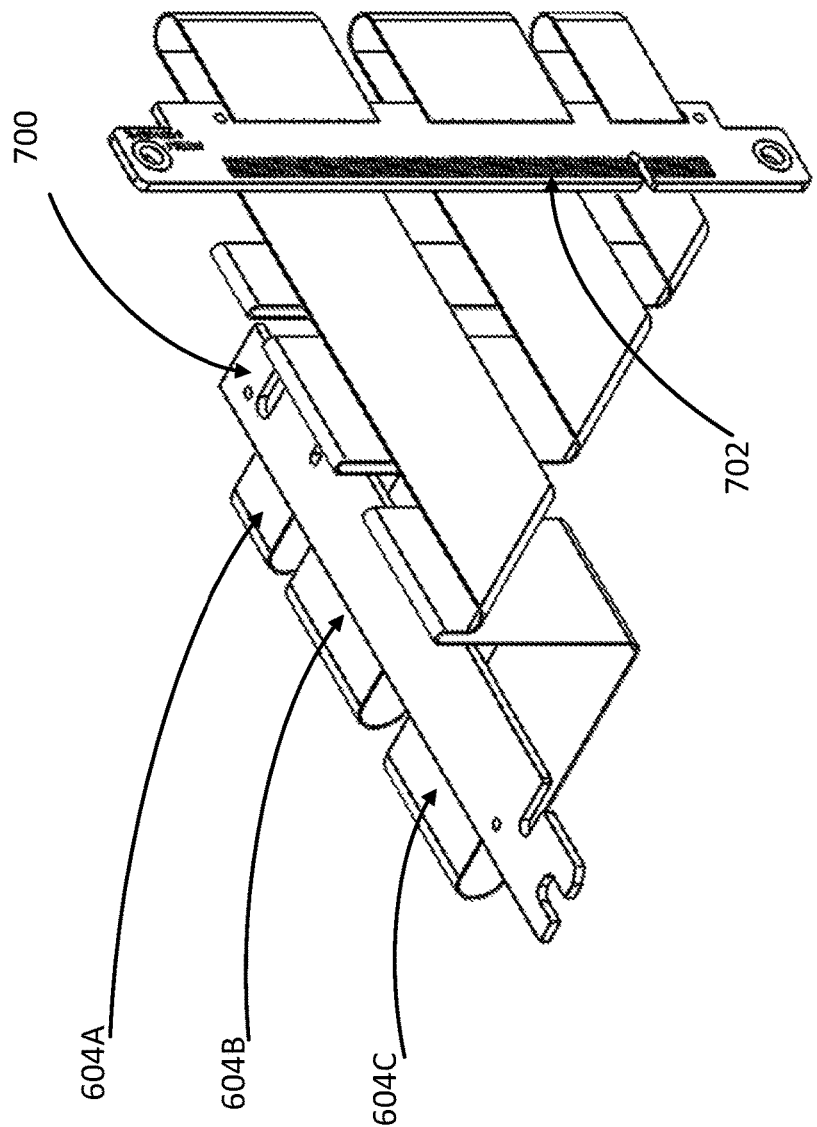
FIG. 7 illustrates a Peripheral Connect Interface Express cable assembly, according to certain embodiments.

FIG. 7 illustrates a Peripheral Connect Interface Express cable assembly 700. Peripheral Connect Interface Express cable assembly 700 includes a GPU connector 702 for connecting to GPU 403. Peripheral Connect Interface Express cable assembly 700 also includes PCIe ribbon cables 604A, 604B, 604C for connecting GPU 403 with motherboard 601.

Figure 8:
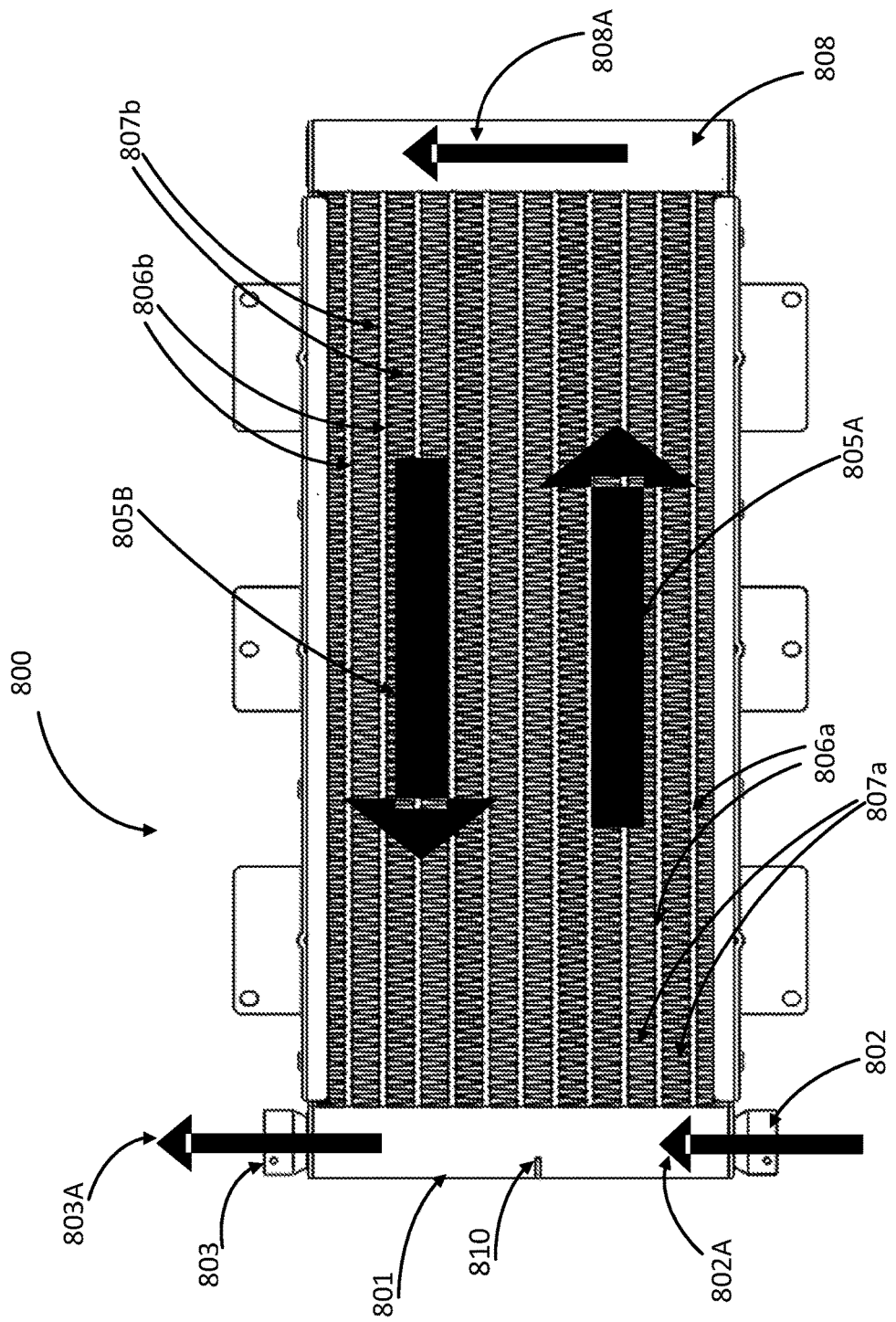
FIG. 8 illustrates a radiator that can be used with a GPU or CPU liquid cooler, according to certain embodiments.

FIG. 8 illustrates a radiator that can be used with a GPU or CPU liquid cooler, according to certain embodiments. FIG. 8 shows a radiator 800. Radiator 800 includes a bottom manifold 801, top manifold 808, a plurality of pipes 806a, 806b and fins 807a, 807b. Bottom manifold 801 includes an inlet 802 and outlet 803. Bottom manifold 801 includes an internal divider wall (not shown) at location 810. This internal divider wall divides bottom manifold 801 into approximately 2 halves. Pipes 806a and corresponding fins 807a occupy approximately half of the radiator. Pipes 806b and corresponding fins 807b occupy the other half of the radiator, approximately.

According to certain embodiments, heat transfer can occur as follows. To explain, liquid coolant transfers heat from the CPU (via a cold plate) and the hot liquid coolant enters the radiator 800 at the inlet 802 of bottom manifold 801. The flow 802A of hot liquid coolant is pumped through the plurality pipes 806a towards top manifold 808. The fins 807a help cool the hot liquid coolant as it flows (805A) towards top manifold 808. When the liquid coolant reaches top manifold 808, it flows (808A) towards the plurality of pipes 806b. The liquid coolant is then forced through the plurality of pipes 806b and is further cooled by fins 807b as the liquid coolant flows (805B) back towards bottom manifold 801. Fins 807a, 807b effectively increase the surface area of pipes 806a, 806b to allow better heat transfer from the hot liquid coolant to the surrounding air. As a consequence, by the time the liquid coolant returns to bottom manifold 801, the liquid coolant is relatively cool as it flows (803A) out of radiator 800 through outlet 803 to return to the CPU to cool the CPU. Likewise, in the case of the GPU (graphics processing unit), the GPU's radiator functions in a like manner as described above with respect to the CPU.

The CPU and GPU, each have their own cold plate assembly attached directly to the major heat source in the CPU and GPU, respectively. According to certain embodiments, each of the cold plates (e.g., one for the CPU and one for the GPU) comprises a small cavity that is bordered along its major axis, a metal plate, made of metal with a thermal conductivity no less than 50 W/mK and no more than 1500 W/mK, for example. The metal plate has a series of thin fins on one side, achieved usually by microskiving, through which fluid flows and absorbs heat from the metal. The cold plate assembly is contained by an enclosure that is made of a material that is impermeable to the coolant fluid and has sufficient structural integrity to withstand the clamping force and operating pressure/temperature range.

According to certain embodiments, tubing for carrying the coolant fluid consists of a flexible rubber, plastic, or a Teflon based material that is specifically designed for low permeation of the coolant elements (typically a mixture of water, propylene glycol, a corrosion inhibitor, and an antimicrobial compound). The tubing can be extra-long so as to serve as a service loop that can access the other components in the chassis without disconnecting the cooling solution from the radiators, pumps, chassis, or cold plates.

While the system is designed to take advantage of convective airflow by creating a thermal chimney effect within the chassis, the use of one or more cooling fans can dramatically increase the heat capacity of the system (e.g., exhaust fan can be installed at the top of the chassis such as location 106, see FIG. 1, according to certain embodiments). Furthermore, a fan may be installed to provide cooling airflow to other components that generate heat but are not connected to the coolant fluid loops. Such components include but are not limited to regulation components, processing elements, storage devices, memory, and data interfaces in the chassis. The natural bottom to top (with respect to gravity) airflow design promotes highly laminar flow over the radiators and also over the internal components installed in the chassis. The CPU, GPU, and PSU thermal loads are separated into distinct chambers.

The PSU thermal chamber draws in cold air from the side of the chassis and exhausts air at the rear panel (at the rear of the chassis). This allows the PSU to always draw in cold outside air rather than preheated internal ambient air inside the chassis. Using a cold air intake reduces the demand for the PSU fan.

According to certain embodiments, the graphics card is oriented within its chamber in an "upside-down" fashion, positioning heat-generating surface-mounted components (voltage regulators and memory, for example) on the PCB that are not the GPU itself near the top exhaust fan. Further, these surface components are cooled by a heatsink-and-fan assembly comprising aluminum and heat pipes with a fan in the chassis. This heat sink's fan circulates air through the heatsink of the GPU assembly and its proximity to the top exhaust allows for rapid and unimpeded movement of heat out of the chassis, providing efficient cooling to surface components on the graphics card.

Graphics card orientation within its chamber is also intended to allow for stable shipment (as the PCB itself is mounted directly to the dividing plane) and future upgrade/serviceability. End users with moderate technical skill should be able to replace the graphics card within this chamber.

According to certain embodiments, the graphics card's autonomous cooling system can be wholly disconnected from the primary cooling system without impacting operation, allowing the computer to be configured with a graphics card that has an integrated cooling system separate from the rest of the computer provided that card is cooled via a heatsink-and-radial-fan assembly.

The graphics card's outputs are bridged to modular input-output assemblies in the front and rear of the chassis, allowing these port clusters to be upgraded/altered/changed without affecting the rest of the computer. This reinforces the intended upgradability for the graphics card, as generations of graphics cards often bring with them changes to their display output configurations.

The system may include a control system inside the chassis to control the chassis fan(s) speed by monitoring sensors associated with component temperature, liquid coolant temperature, or power supply load to determine the cooling needs of the system and adjust fan speed accordingly with the goal of providing adequate cooling at minimal noise. The control system may have an external data interface or operate standalone. The control system may be analog with discrete components or digital with a logic device or micro controller and it may output different voltages to the fan motor or a digital control signal such as pulse width modulation to regulate the fan's speed. The control system measures the temperature of each liquid loop independently near its primary heat source (CPU, GPU, etc.) and considers each fluid independently when selecting the proper fan speed for the whole system. Intelligence may reside in one or more pumps or in one or more chambers and can rely on remote probes to read temperature, pump speed, and presence detection of other liquid loops. If the controller detects a failure of any system pump or fan via RPM or failure of any temperature sensor out of range temperature value, then it can blink one or more LEDs to indicate an error condition to the operator as well as flag the error to the monitoring software running in the operating system.

According to certain embodiments, a computer chassis comprises: 1) a chassis frame encompassing a chassis cavity, the computer chassis having a top chassis portion oriented in a first X-Y plane of the computer chassis, a bottom chassis portion oriented in a second X-Y plane of the computer chassis, a front chassis portion oriented in a first X-Z plane of the computer chassis, and a rear chassis portion oriented in a second X-Z plane of the computer chassis; 2) a right side outer panel oriented in a first Y-Z plane of the computer chassis; 3) a left side outer panel oriented in a second Y-Z plane of the computer chassis; 4) a central solid bulkhead in the chassis cavity, the central solid bulkhead occupying an entire cross sectional area of the chassis cavity and is oriented in a third Y-Z plane of the computer chassis, where the third Y-Z plane is located about midway in an X direction of the computer chassis, wherein: the central solid bulkhead runs from the top chassis portion to the bottom chassis portion and from the front chassis portion to the rear chassis portion; and the central solid bulkhead divides the chassis cavity into a first chassis cavity portion and a second chassis cavity portion; 5) a chamber partition in the second chassis cavity portion, the chamber partition occupying an entire cross sectional area of the second chassis cavity portion and is oriented in an X-Y plane and divides the second chassis cavity portion to create a third chassis cavity portion; 6) wherein the first chassis cavity portion forms a first thermal chamber of the computer chassis, the second chassis cavity portion forms a second thermal chamber of the computer chassis; and the third chassis cavity portion forms a third thermal chamber of the computer chassis The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

We claim:
1. A computer chassis comprising:
a chassis frame encompassing a chassis cavity, the computer chassis having a top chassis portion oriented in a first X-Y plane of the computer chassis, a bottom chassis portion oriented in a second X-Y plane of the computer chassis, a front chassis portion oriented in a first X-Z plane of the computer chassis, and a rear chassis portion oriented in a second X-Z plane of the computer chassis;
a right side outer panel oriented in a first Y-Z plane of the computer chassis;
a left side outer panel oriented in a second Y-Z plane of the computer chassis;
a central solid bulkhead in the chassis cavity, the central solid bulkhead occupying an entire cross sectional area of the chassis cavity and is oriented in a third Y-Z plane of the computer chassis, where the third Y-Z plane is located about midway in an X direction of the computer chassis,
wherein:
the central solid bulkhead runs from the top chassis portion to the bottom chassis portion and from the front chassis portion to the rear chassis portion; and
the central solid bulkhead divides the chassis cavity into a first chassis cavity portion and a second chassis cavity portion;
a chamber partition in the second chassis cavity portion, the chamber partition occupying an entire cross sectional area of the second chassis cavity portion and is oriented in an X-Y plane and divides the second chassis cavity portion to create a third chassis cavity portion;
wherein the first chassis cavity portion forms a first thermal chamber of the computer chassis, the second chassis cavity portion forms a second thermal chamber of the computer chassis; and the third chassis cavity portion forms a third thermal chamber of the computer chassis.

2. The computer chassis of claim 1, wherein the second chassis cavity portion is for housing a motherboard and a corresponding central processing unit associated with the motherboard.

3. The computer chassis of claim 1, wherein the first chassis cavity portion is for housing a graphics processing unit.

4. The computer chassis of claim 1, wherein the third chassis cavity portion is for housing a power supply unit.

5. The computer chassis of claim 1, wherein the first chassis cavity portion is for housing a first radiator unit.

6. The computer chassis of claim 1, wherein the second chassis cavity portion is for housing a second radiator unit.

7. The computer chassis of claim 5, wherein the first radiator unit is associated with a pump to circulate liquid coolant from a heat source in the computer chassis to the first radiator unit, wherein the liquid coolant removes heat from the heat source and the liquid coolant is cooled at the first radiator unit.

8. The computer chassis of claim 6, wherein the second radiator unit is associated with a pump to circulate liquid coolant from a heat source in the computer chassis to the second radiator unit, wherein the liquid coolant removes heat from the heat source and the liquid coolant is cooled at the second radiator unit.

9. The computer chassis of claim 1, further comprising at least one exhaust fan located at the top chassis portion, wherein the at least one exhaust fan pulls air out of the first and second thermal chambers of the computer chassis.

10. The computer chassis of claim 1, further comprising at least one fan located in the third thermal chamber to supply airflow to the power supply unit based on an internal temperature of the power supply unit.

11. The computer chassis of claim 1, wherein the right side outer panel allows air from outside the computer chassis to flow into the computer chassis.

12. The computer chassis of claim 1, wherein the left side outer panel allows air from outside the computer chassis to flow into the computer chassis.

13. The computer chassis of claim 1, wherein the bottom chassis portion allows air from outside the computer chassis to flow into the computer chassis.

* * * * *